United States Patent [19]

Harrington

[11] 4,439,740
[45] Mar. 27, 1984

[54] CORPORATE AMPLIFIER APPARATUS WITH IMPROVED DEGRADATION

[75] Inventor: Timothy A. Harrington, Cedar Rapids, Iowa

[73] Assignee: Rockwell International Corporation, El Segundo, Calif.

[21] Appl. No.: 364,582

[22] Filed: Apr. 1, 1982

[51] Int. Cl.³ .............................................. H03F 3/68
[52] U.S. Cl. ................................ 330/124 R; 330/286; 330/298
[58] Field of Search ................. 330/124 D, 124 R, 53, 330/54, 286, 207 R, 295, 207 P, 298

[56] References Cited

U.S. PATENT DOCUMENTS

| | | | |
|---|---|---|---|
| 3,753,138 | 8/1973 | Svendsen | 330/124 |
| 4,010,426 | 3/1977 | Rambo | 330/53 |
| 4,064,464 | 12/1977 | Morse | 330/124 R |
| 4,315,222 | 2/1982 | Saleh | 330/124 D |

OTHER PUBLICATIONS

Adel A. M. Saleh, "Improving the Graceful Degradation Performance of Combined Power Amplifiers," *IEEE Transactions of Microwave Theory and Techniques*, vol. MTT-28, Oct. 10, 1980, pp. 1068–1070.

*Primary Examiner*—James B. Mullins
*Assistant Examiner*—G. Wan
*Attorney, Agent, or Firm*—Richard K. Robinson; George A. Montanye; H. Fredrick Hamann

[57] ABSTRACT

A corporate amplifier is defined as and includes a plurality of N amplifier modules where N is a positive integer that is greater than one. The plurality of amplifier modules are driven by a power splitter which takes a signal that is to be amplified and divides it into N equal amplitude components. Each component is applied to a member of the plurality of N amplifier modules for amplification. The outputs of the power amplifier modules are combined by a power combiner that has N input terminals with each input terminal being connected to an output terminal of a member of the plurality of N amplifier modules. A fault detector detects failure of one or more of the plurality of N amplifier modules and provides a fault signal indicating thereby a failed amplifier module. A compensation circuit compensates both the power splitter and the power combiner means so that if a fault is detected in one or more of the plurality of N amplifier modules the performance of the corporate amplifier will be optimized.

7 Claims, 3 Drawing Figures

CORPORATE AMPLIFIER APPARATUS WITH IMPROVED DEGRADATION

BACKGROUND OF THE INVENTION

This invention relates to power amplifier circuits with fault detection and, in particular, for fault detection for power amplifiers with combined power amplifier modules that are driven by a power splitter and their outputs combined by a power combiner.

The standard method of employing an N array of hybrid power splitters and combiners to combine N amplifiers offer some sort of degradation performance when one or more of the power amplifiers fails.

In an article published in the *IEEE Transactions on Microwave Theory and Techniques*, Volume NTT-28, No. 10, October 1980 entitled "Improving the Graceful-Degradation Performance of Combined Power Amplifiers" by Adel A. M. Saleh, it was disclosed that the degradation to the combined circuit caused by the failed amplifier would be minimized by either shorting the input of a power combiner that is connected to a failed amplifier, or opening the combiner circuit of the failed amplifier.

A corporate amplifier is defined as and includes a plurality of N amplifier modules where N is a positive integer that is greater than one. The plurality of amplifier modules are driven by a power splitter which takes a signal that is to be amplified and divides it into N equal amplitude components. Each component is applied to a member of the plurality of N amplifier modules for amplification. The outputs of the power amplifier modules are combined by a power combiner that has N input terminals with each input terminal being connected to an output terminal of a member of the plurality of N amplifier modules. A fault detector detects failure of one or more of the plurality of N amplifier modules and provides a fault signal indicating thereby a failed amplifier module. A compensation circuit compensates both the power splitter and the power combiner means so that if a fault is detected in one or more of the plurality of N amplifier modules the performance of the corporate amplifier will be optimized.

A fault or a failure of an amplifier module is detected by sensing the DC current drawn by an amplifier module to obtain a sense signal for each amplifier module. These sense signals are averaged by an averaging circuit to determine an average current level which is used as a reference signal. A window, comprising an upper level and a lower level, is established in the reference signal as well as in each of the individual sense signals. A plurality of N comparators compares each sense signal's upper level and lower level with the average signal's upper level and lower level to ascertain if the the current produced by amplifier module represented by the sense signal is drawing a current level which is outside of the preordained DC current window which indicates an amplifier module fault. A high level comparison and a low level comparison is made. The results of these comparisons are OR'd together to obtain a fault signal which is used to compensate both the power splitter and the power combiner for the fault so as to optimize the performance of the corporate amplifier.

Depending on the power splitter and power combiner type, the compensation circuit will remove the faulted amplifier module from the circuit. If the balance resistor, used to balance each array with its neighbors, has a large resistance value such as infinity, both the output terminal of the power splitter and the input terminal of the power combiner will be shorted. Alternatively, if the balancing resistors have a low resistance such as zero ohms, the output terminal of the power splitter and the input terminal of the power combiner are opened.

It is the object of this invention to provide a corporate amplifier that includes a plurality of combined amplifier modules and wherein if one amplifier module should fail, that fault will be detected and compensation will be provided to the power splitter that drives the plurality of amplifier modules and to the power combiner that combines the output of the power amplifier modules such that there will be equal load sharing of the remaining amplifier modules following an amplifier module failure.

It is another object of the invention to provide a corporate amplifier that includes a plurality of combined amplifier modules that are divided and then recombined after amplification by a power splitter and power combiner in which the power splitter and power combiner have a balance resistance equal to zero in one embodiment and infinity in a second embodiment.

BRIEF DESCRIPTION OF THE DRAWINGS

These advantages, and others, of the present invention may be ascertained from a reading of the specification and the claims in conjunction with the figures in which:

DETAILED DESCRIPTION OF THE PREFERRED EMBODIMENT

Figure 1:
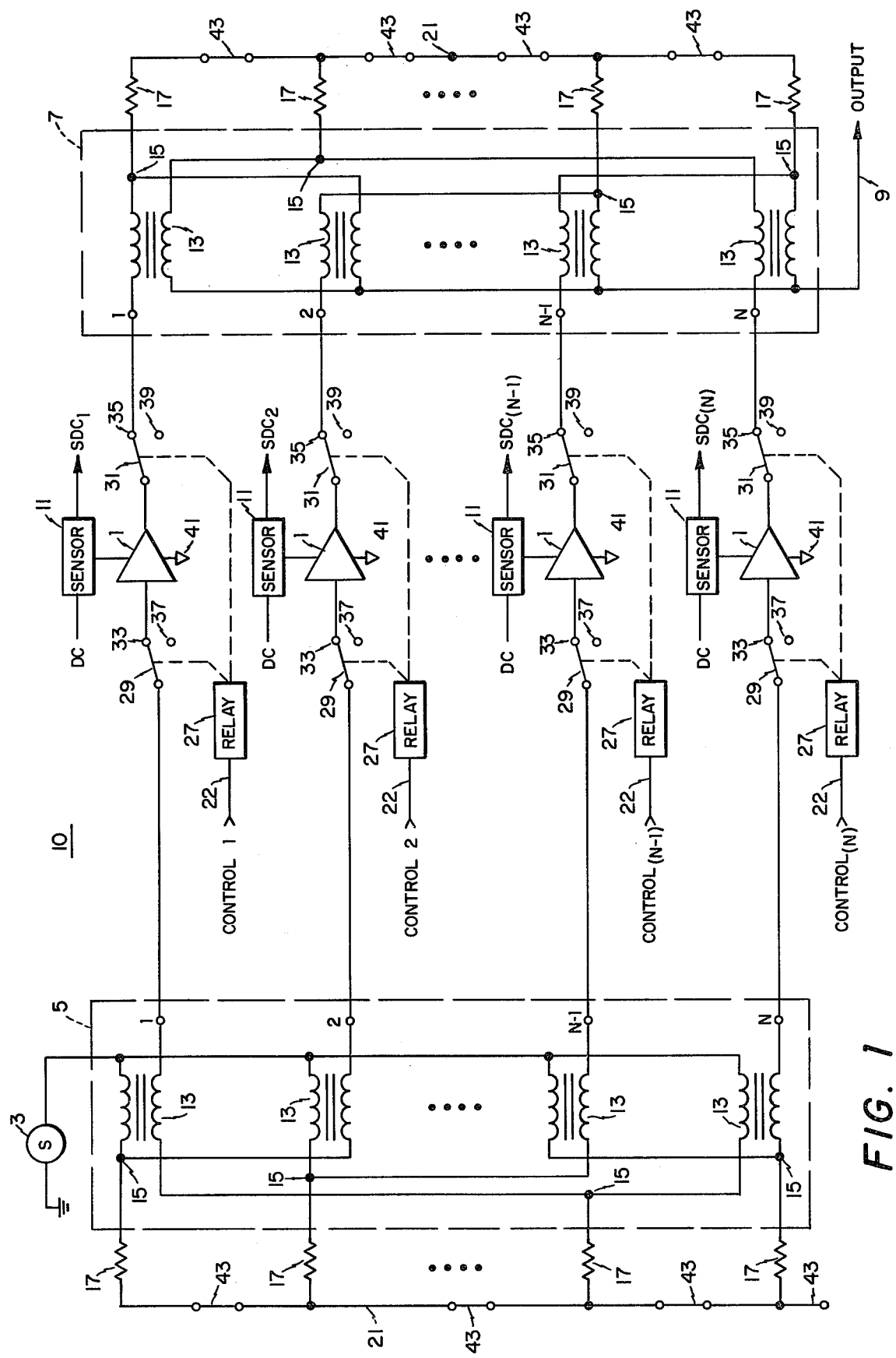
FIG. 1 is a block diagram of a corporate amplifier that has a plurality of combined amplifier modules according to the invention.

In FIG. 1, to which reference should now be made, there is shown a block diagram of a corporate amplifier 10 according to the invention. The corporate amplifier includes a plurality of N amplifier positions where N is a positive number that is greater than one. Included in each amplifier position is an amplifier module 1. The N amplifier modules are driven by a signal source 3 whose output is connected to the input terminal of a power splitter 5 which divides the input signal into N signals that appear on terminals 1 through N. The signal is amplified in each position by the amplifier module 1 and applied to the input terminals 1 through N of a power combiner 7 which recombines the amplified signal and applies it to output terminal 9. Each amplifier module 1 has a sensor 11 that senses the current that is applied to the amplifier module 1 by a DC power source (not shown). The sensors 11 provide an output of N sense DC signals, $SDC_1$ through $SDC_N$ which are applied to the fault detector circuit of FIG. 3.

The power splitter 5 and the power combiner 7 include a plurality of transformers 13 whose numbers correspond to the number of output terminals desired on the power combiner. A first end of the primary of each transformer 13 is connected to the appropriate output terminals of 1 through N. One end of the secondary winding of the transformers 13 are joined together to form a common bus and this end is used to receive the input signal from the signal source 3 or to provide the output signal on the output terminal 9. The other end of the primary of each transformer 13 is tied to at least one other transformer at a junction point 15 which is also connected to balancing resistor at a balancing resistor position 17. The opposite ends of the balancing resistors at positions 17 are connected to one other via a junction bus 21.

In the embodiment illustrated in FIG. 1 the balancing resistors at positions 17 form a configuration of a conventional splitter/combiner known in the prior art where each resistor has to be selected to provide balancing between the different transformers 13. In accordance with this embodiment of the present invention, however, the balancing resistors at positions 17 can be made equal to zero (e.g., by shorting). Under these conditions, the amplifier system of the present invention can then be operated such that if a fault is detected by the fault detector circuits, the relays 27 in relay positions 1 through N will cause relay contacts 29 and 31 to become disengaged from terminals 33 and 35 of the faulted amplifier module and engage with terminals 37 and 39 opening the appropriate output terminal of the splitter 5 and the input terminal to the power combiner 7 compensating the power splitter 5 and the power combiner 7 for the loss of the failed amplifier module. Alternatively, the balancing resistors at positions 17 of the power splitter 5 and the power combiner 7 can be selected to have a very high impedance, such as infinity (e.g., by forming an open circuit at positions 17 or 43) in which case the control relays 27 are selected to disconnect from the amplifier module 1 and connect contact 29 and 31 to a common reference potential (terminal) such as ground 23. This embodiment is shown in FIG. 2 in which the jumpers 43 have been removed from the power splitter 5 and the power combiner 7 facilitating a high impedance in place of balancing resistors at positions 17.

Figure 2:
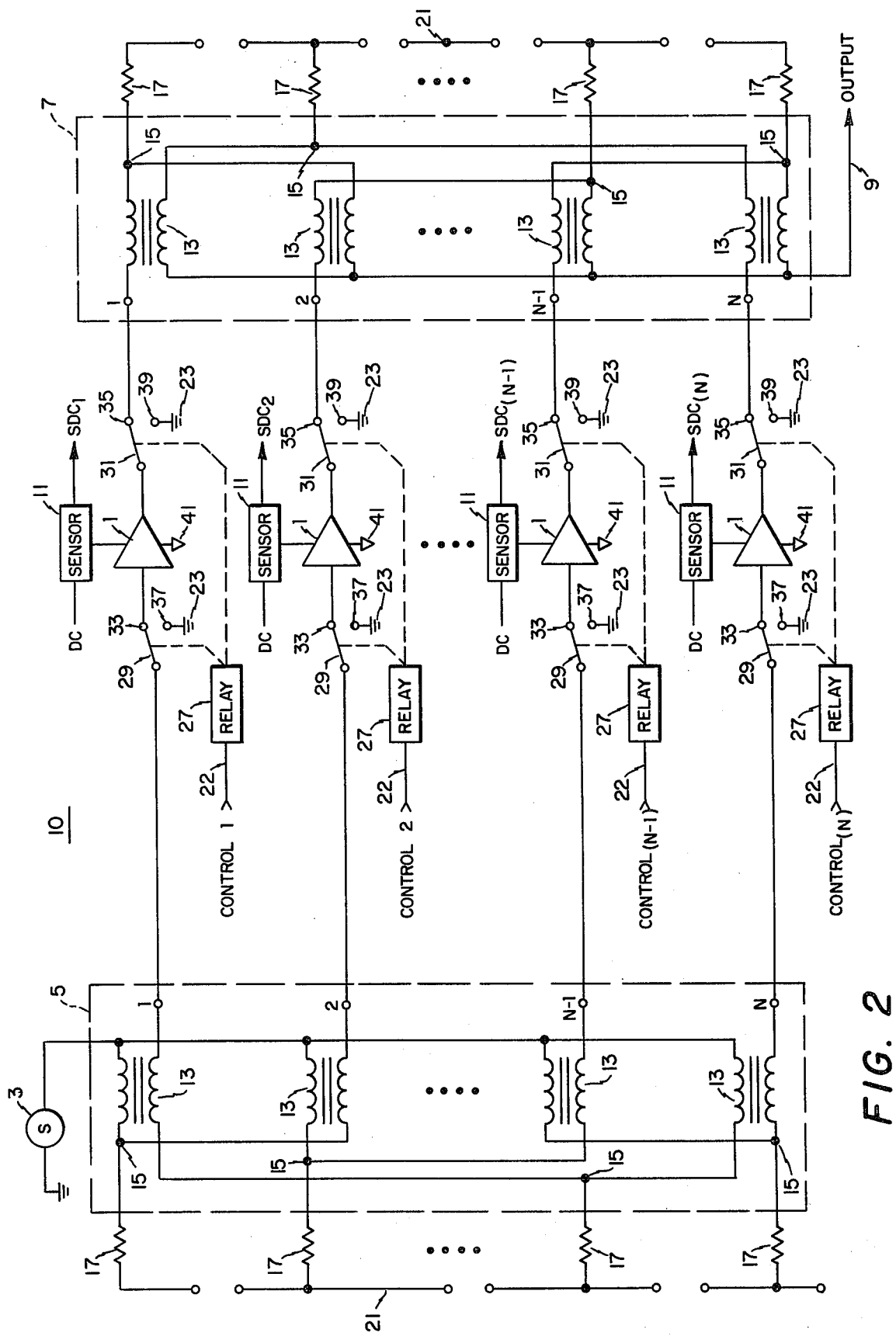
FIG. 2 is a second embodiment of a corporate amplifier that has a plurality of combined amplifier modules according to a second embodiment of the invention.

In FIG. 2 when the control relay 27 is activated because of an amplifier module 1 failure then the contacts 29 and 31 are removed from terminals 33 and 35 respectively and contact 29 is connected to a terminal 37 and contact 31 is connected to contact 39 connecting both the output terminal of the power splitter 5 and the input terminal of the power combiner 7 to ground 23. These connectors result in the effective removal of the failed amplifier module 1 from the faulted circuit.

Figure 3:
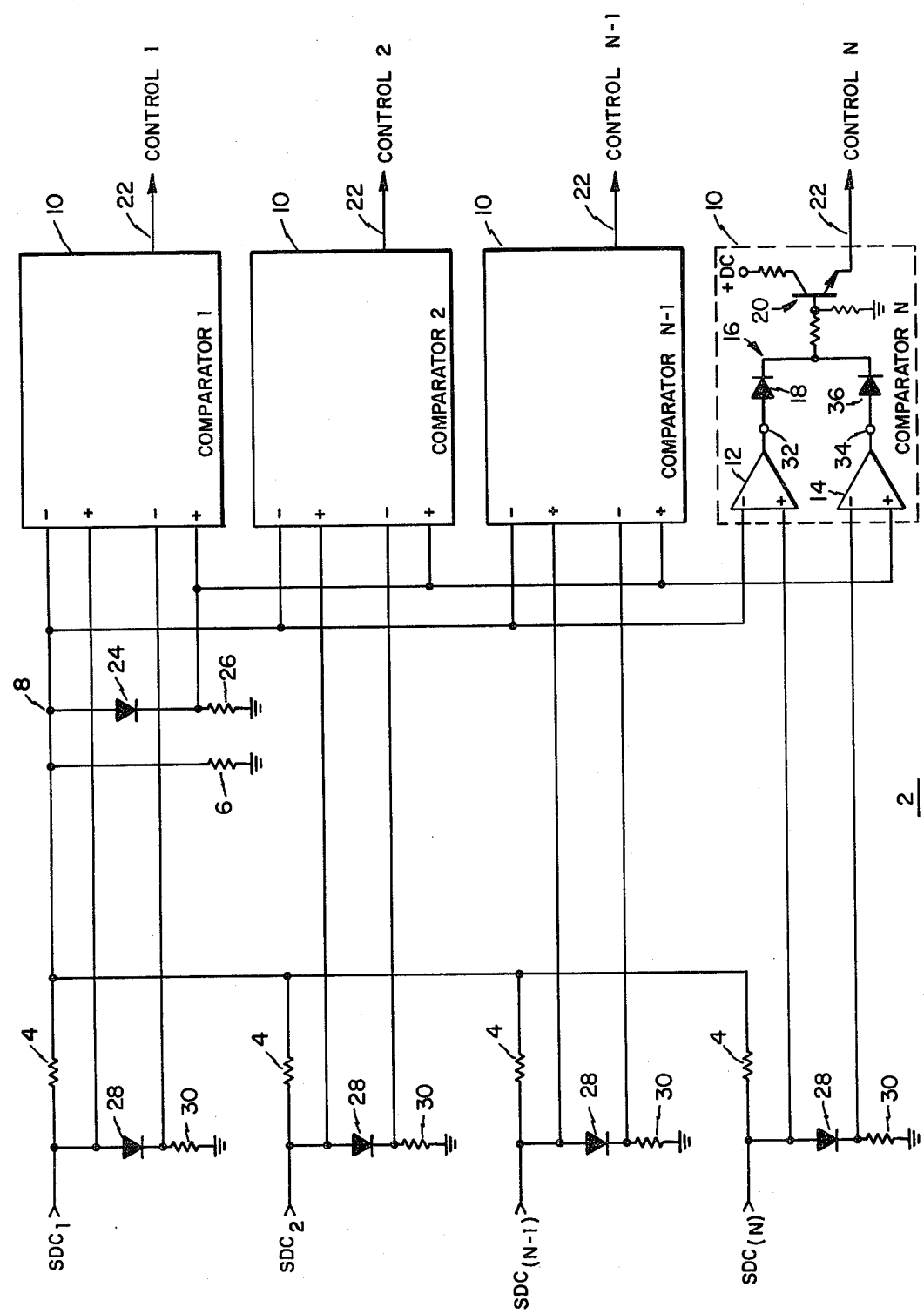
FIG. 3 is a schematic diagram of the fault detector circuits used to detect amplifier module faults in the embodiments of FIGS. 1 and 2.

A fault detection circuit 2 is provided in FIG. 3 and provides for summing the sensed DC signals 1 through N by a summing circuit that includes an input summing resistor 4 for each position 1 through N of the detector circuit 2. The sensed DC signals 1 through N are averaged by averaging resistor 6 to obtain an average signal at node 8. There are N comparators 10 that are used for determining the thresholds. Each comparator 10 includes a first amplifier 12, a second amplifier 14, an OR circuit 16 that includes two diodes 18 with their cathodes tied together and a transistor switch circuit 20 that is used to provide the control 1 through N for controlling the relays N on terminal 22. A threshold window is established by comparing the voltage drop that is established by a forward bias diode 24 and a resistor 26 of the average signal for comparison with a similar window that is established by a diode 28 and a resistor 30 for each position 1 through N of the detector circuit. Each amplifier 12 compares $SDC_N$ with the average signal at node 8 to obtain a first difference signal that is applied to junction point 32. Amplifier 14 compares the low level signal that is one forward voltage drop diode lower than the average signal as a result of the average signal passing through the diode 24 with the signal that is present on the cathode of diode 28 which is also a low level DC signal. The result of the comparison is provided at terminal 34. If diode 18 becomes forward biased then this indicates that the faulted circuit has failed as indicated by high DC current flow detected by sensor 11 and will cause the transistor switch 20 to connect terminal 22 to the positive DC source causing the appropriate control relay 27 to pull in the contacts 29 and 35 of FIGS. 1 and 2. If however, the amplifier module 1 draws a very low current the difference amplifier 14 provides a positive voltage on terminal 34 forward biasing diode 36 which again will cause the transistor switch 20 to connect terminal 22 to a positive DC source activating the relay 27 and connecting thereby the relay contacts 29 and 31 to terminals 37 and 39 respectively.

When the fault detection circuit detects failure of an amplifier module 1 in the embodiment of FIG. 1, it causes the input and output relays to the faulted amplifier module presenting an open circuit for both the input power splitter and the output power combiner and since the balancing resistors have an effective resistance of zero, optimum circuit operation for the power splitter and combiner is achieved. In the embodiment of FIG. 2 the balancing resistors have an infinite impedance, open circuit. In this case, the output and input terminals of the power splitter and combiner respectively are shorted. Therefore, the detection circuitry which detects the failed module causes the appropriate relay 27 to be pulled in and short the input to and the output from the amplifier module to ground resulting in optimization of the performance of the overall combination that includes the power amplifier module.

Many changes and modifications in the above described embodiments of the invention can, of course, be carried out without departing from the scope thereof. Accordingly, the invention is disclosed and is intended to be limited only by the scope of the appending claims.

I claim:

1. In an amplifying system including a power splitter means for receiving an input signal and dividing that signal to provide a plurality of power splitter outputs and normally including a plurality of balancing resistor positions, an amplifier associated with a different one of each of said plurality of outputs wherein each amplifier has an input coupled to one of said plurality of outputs and an amplifier output, and a power combiner means having a plurality of power combiner inputs with each input associated with and coupled to a different one of said amplifier outputs for combining the amplifier outputs and providing a combined output signal, wherein said combiner means normally has a plurality of balancing resistor positions, the improvement in said amplifier system comprising:

said power combiner means and power splitter means being constructed and arranged to have one of a substantially zero selected impedance at said balancing resistor positions and a substantially infinite selected impedance at said balancing resistor positions;

means coupled to each of said amplifiers for detecting faults in an amplifier and providing a fault signal representing a faulty amplifier; and means responsive to said fault signal for selectively providing an electrical open circuit between the input of said faulty amplifier and its associated power splitter output and the output of said amplifier and its associated power combiner input when said selected impedance is substantially zero and for coupling the power combiner output associated with the input of said faulty amplifier and the power splitter input associated with the output of said faulty amplifier to a common terminal when said selected impedance is substantially infinite.

2. The system of claim 1 wherein said means for detecting faults comprises:
 a plurality of sensors for sensing amplifier current flow, each of said sensors being coupled to a different one of said amplifiers to provide a sensor output;
 means for averaging all of said sensor outputs to provide a threshold signal; and
 means for comparing the sensor output from each of said sensors with said threshold signal to provide said fault signal.

3. The system of claim 2 wherein said means for averaging comprises:
 means for receiving all of said sensor outputs and providing a first reference output and a second reference output; and wherein said means for comparing comprises:
 means for comparing each sensor output with said first and second reference outputs to provide first and second difference outputs; and
 means responsive to said difference outputs for providing said fault signal.

4. The system of claim 3 wherein said means responsive to said difference outputs is an OR circuit which provides said fault signal in response to either one of said first and second difference outputs.

5. The system of claim 2 wherein said means for averaging comprises:
 a plurality of first diodes, each first diode having an anode terminal coupled to a different one of said sensor outputs and a cathode coupled through an impedance to ground;
 a common terminal coupled to receive each of said sensor output signals from the anode of each diode;
 an averaging impedance coupled to said common terminal to average said sensor outputs to produce an average signal at said common terminal; and
 a second diode having its anode coupled to said common terminal and its cathode coupled through an impedance to ground; and wherein said means for comparing comprises:
 a plurality of comparators, each comparator being constructed and arranged to compare one of the sensor output signals with a threshold to provide a control signal, each comparator comprising:
 a first differential amplifier having a positive input coupled to the anode of one of said plurality of first diodes, a negative input coupled to said common terminal, and an output coupled to an anode of a third diode;
 a second differential amplifier having a positive input coupled to the cathode of said second diode, a negative input coupled to the cathode of said one of said plurality of first diodes and an output coupled to an anode of a fourth diode;
 a transistor having a base emitter and collector; and
 said third and fourth diodes each having a cathode which is coupled to the base of said transistor to control the current flow in a path formed by said collector and emitter to provide said fault signal.

6. In an amplifying system including a power splitter means for receiving an input signal and dividing that signal to provide a plurality of power splitter outputs and normally including a plurality of balancing resistor positions, an amplifier associated with a different one of each of said plurality of outputs wherein each amplifier has an input coupled to one of said plurality of outputs and an amplifier output, and a power combiner means having a plurality of power combiner inputs with each input associated with and coupled to a different one of said amplifier outputs for combining the amplifier outputs and providing a combined output signal, wherein said combiner means normally has a plurality of balancing resistor positions, the improvement in said amplifier system comprising:
 said power combiner means and power splitter means being constructed and arranged to have a substantially zero impedance at said balancing resistor positions;
 means coupled to each of said amplifiers for detecting faults in an amplifier and providing a fault signal representing a faulty amplifer; and
 means responsive to said fault signal for selectively providing an electrical open circuit between the input of said faulty amplifier and its associated power spitter output and the output of said amplifier and its associated power combiner input.

7. In an amplifying system including a power splitter means for receiving an input signal and dividing that signal to provide a plurality of power splitter outputs and normally including a plurality of balancing resistor positions, an amplifier associated with a different one of each of said plurality of outputs wherein each amplifier has an input coupled to one of said plurality of outputs and an amplifier output, and a power conbiner means having a plurality of power combiner inputs with each input associated with and coupled to a different one of said amplifier outputs for combining the amplifier outputs and providing a combined output signal, wherein said combiner means normally has a plurality of balancing resistor positions, the improvement in said amplifier system comprising:
 said power combiner means and power splitter means being constructed and arranged to have a substantially infinite impedance at said balancing resistor positions;
 means coupled to each of said amplifiers for detecting faults in an amplifier and providing a fault signal representing a faulty amplifier; and
 means responsive to said fault signal for coupling the power splitter output associated with the input of said faulty amplifier and the power combiner input associated with the output of said faulty amplifier to a common terminal.

* * * * *